US010564223B2

(12) United States Patent
Abe et al.

(10) Patent No.: US 10,564,223 B2
(45) Date of Patent: Feb. 18, 2020

(54) POWER STORAGE SYSTEM, CONTROL SYSTEM OF SECONDARY BATTERY, AND CONTROL METHOD OF SECONDARY BATTERY

(71) Applicant: HITACHI, LTD., Tokyo (JP)

(72) Inventors: Makoto Abe, Tokyo (JP); Takanori Yamazoe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 135 days.

(21) Appl. No.: 15/758,506

(22) PCT Filed: Jun. 16, 2016

(86) PCT No.: PCT/JP2016/067918
§ 371 (c)(1),
(2) Date: Mar. 8, 2018

(87) PCT Pub. No.: WO2017/043142
PCT Pub. Date: Mar. 16, 2017

(65) Prior Publication Data
US 2018/0246172 A1 Aug. 30, 2018

(30) Foreign Application Priority Data

Sep. 9, 2015 (JP) ................................. 2015-177665

(51) Int. Cl.
*H02J 7/00* (2006.01)
*G01R 31/3842* (2019.01)
(Continued)

(52) U.S. Cl.
CPC ....... *G01R 31/3842* (2019.01); *G01R 31/392* (2019.01); *H01M 10/0525* (2013.01);
(Continued)

(58) Field of Classification Search
CPC ..................................................... H01M 10/44
(Continued)

(56) References Cited

U.S. PATENT DOCUMENTS

2015/0229150 A1* 8/2015 Nakamori ............. H02J 7/0052
320/107

FOREIGN PATENT DOCUMENTS

JP      04-145844 A    5/1992
JP      2011-215083 A  10/2011
(Continued)

OTHER PUBLICATIONS

International Search Report for WO 2017/043142 A1, dated Aug. 23, 2016.
(Continued)

*Primary Examiner* — Edward Tso
*Assistant Examiner* — Ahmed H Omar
(74) *Attorney, Agent, or Firm* — Volpe and Koenig, P.C.

(57) ABSTRACT

In a power storage system equipped with a secondary battery, a control system of the secondary battery includes a unit which detects an index indicating a degradation state of a positive electrode, a unit which detects an index indicating a degradation state of a negative electrode, a unit which calculates a difference between the index of the positive electrode and the index of the negative electrode, a unit which determines a sign of the difference, and a unit which changes an operation condition of the secondary battery according to the sign. With this configuration, in the control of the secondary battery, it is possible to avoid a life estimation accuracy from being decreased while using a processor which has a high-speed processing performance and is inexpensive.

15 Claims, 4 Drawing Sheets

(51) Int. Cl.
  *H01M 10/48*    (2006.01)
  *H01M 10/0525*  (2010.01)
  *H01M 10/42*    (2006.01)
  *G01R 31/392*   (2019.01)
  *H01M 10/44*    (2006.01)

(52) U.S. Cl.
  CPC ......... *H01M 10/425* (2013.01); *H01M 10/44* (2013.01); *H01M 10/48* (2013.01); *H01M 10/486* (2013.01); *H01M 2010/4271* (2013.01); *H01M 2010/4292* (2013.01); *H01M 2220/20* (2013.01); *H02J 7/0047* (2013.01)

(58) Field of Classification Search
  USPC ........................................................ 320/134
  See application file for complete search history.

(56) References Cited

FOREIGN PATENT DOCUMENTS

| | | |
|---|---|---|
| JP | 2012-135168 A | 7/2012 |
| WO | 2014/046179 A1 | 3/2014 |

OTHER PUBLICATIONS

Japanese Office Action dated Jul. 23, 2019 for the Japanese Patent Application No. 2015-177665.

\* cited by examiner

POWER STORAGE SYSTEM, CONTROL SYSTEM OF SECONDARY BATTERY, AND CONTROL METHOD OF SECONDARY BATTERY

TECHNICAL FIELD

The present invention relates to a power storage system in which a secondary battery is used.

BACKGROUND ART

A lithium-ion secondary battery, which is a type of nonaqueous electrolyte secondary batteries, has an extremely-high electromotive force (about 3 V or more) compared to an electromotive force (about 1.5 V) of an aqueous electrolyte secondary battery (for example, nickel hydrogen battery, a nickel-cadmium battery, and a lead battery). Therefore, the lithium-ion secondary battery is advantageous in reducing size and weight of the battery and in increasing capacity and output power, and has been commercially available to compact electronic devices such as a portable personal computer and a portable phone. In recent years, an application of the lithium-ion secondary battery is expanded even to large-scale electric devices (for example, a power source for vehicle such as HEV (Hybrid Electric Vehicle) and EV (Electric Vehicle), and a power source for storing power).

There is own that degradation such as a decrease of the battery capacity and an increase of the resistance occurs in a general secondary battery according to the number of use and the number of use days. The number of use herein is defined by the number of cycles in which one cycle corresponds to one time of charging/discharging. Therefore, in a case where the battery is mounted in various types of power storage systems, there is a need to determine an initial battery performance in consideration of the degradation. It is known that a degree of degradation is proportional to a square root of the number of cycles or the number of use days with time. Therefore, when a system is designed, the battery capacity (hereinafter, referred to as "initial battery capacity") of the secondary battery to be mounted at the initial time and the battery performance are determined in consideration of the number of cycles when system life reaches, the number of use or an accumulated charging/discharging capacity by calculating backward from the battery capacity and the battery resistance (collectively referred to as "battery performance when the life reaches") which are necessary when the system life reaches. With this configuration, there is no need to exchange a battery during a period when the system operates, and the system can be improved in reliability.

On the other hand, in an actual use situation, degradation significantly deviates from a transition estimated at the time of designing the system by a root rule, and the degradation of the secondary battery progresses faster than designed (hereinafter, denoted as "decrease of life estimation accuracy"). These problems cause an increase in size and initial cost due to the batteries mounted more than necessary in addition to a decrease of the system reliability caused by an urgent maintenance such as a replacement work of the secondary battery without warning, an increase in a life cycle cost, and a degradation progressing faster than designed.

Regarding such problems, in PTL 1, a correlation resistance value of a positive electrode and a correlation resistance value of a negative electrode are estimated as an inner state related to a remained value such as a degradation speed and a life span of the secondary battery using transition behavior data from a use history based on the states (voltage, current, temperature, use time, etc.) of the secondary battery. A degradation balance is calculated from a ratio of the correlation resistance value of the positive electrode and the correlation resistance value of the negative electrode. In PTL 1, emphasis is placed on improvement of an output performance.

CITATION LIST

Patent Literature

PTL 1: JP 2012-135168 A

SUMMARY OF INVENTION

Technical Problem

The inventor has extensively studied and as a result found out that the process becomes slow in the calculation of the ratio of the correlation resistance values and thus there is a need to make a processor advanced in performance. In addition, it has been also found out that it is not possible to suppress the life estimation accuracy from being slow only by the degradation balance of the correlation resistance value of the positive and negative electrodes even using the technique disclosed in PTL 1.

An object of the invention is not to cause a decrease of a processing speed in the control of a secondary battery in order to avoid the above problems, and to remove a phenomenon that the degradation of the secondary battery is rapidly progressed.

Solution to Problem

In order to achieve the above object, a control system of a secondary battery in a power storage system equipped with the secondary battery according to the invention includes a unit that detects an index indicating a degradation state of a positive electrode, a unit which detects an index indicating a degradation state of a negative electrode, a unit which calculates a difference between the index of the positive electrode and the index of the negative electrode, a unit which determines a sign of the difference, and a unit which changes an operation condition of the secondary battery according to the sign.

Advantageous Effects of Invention

According to the invention, in the control of the secondary battery, it is possible to avoid a life estimation accuracy from being decreased while using a processor which has a high-speed processing performance and is inexpensive.

In addition, according to the invention, a control factor can be set in correspondence with an operation history, and it is also possible to avoid that the life estimation accuracy is decreased due to a variation generated when the battery is manufactured.

DESCRIPTION OF EMBODIMENTS

A control method of a secondary battery according to the invention includes a unit which detects an index indicating a degradation state of a positive electrode, a unit which detects an index indicating a degradation state of a negative electrode, a unit which calculates a difference between the degradation states of the positive/negative electrodes, a unit which determines a sign of the difference between the degradation states, and a unit which changes an operation condition of the secondary battery according to the sign of the difference between the degradation states.

As an example of the secondary battery according to the invention, there is a lithium-ion secondary battery.

The index indicating the degradation states of the positive electrode and/or the negative electrode according to the invention is an index related to a capacity of the secondary battery. More specifically, there are potentials of the respective electrodes at the end stage of discharging of the battery, or the capacity of the positive electrode and/or the negative electrode.

Examples of an operation condition of the secondary battery according to the invention include upper/lower limit values of a temperature of the secondary battery, upper/lower limit voltages of the battery, upper/lower limit values of a charging capacity (referred to as "upper/lower limit SOC" (SOC is the abbreviation for State of Charge)), and an intermediate value (hereinafter, referred to as "center SOC") of the upper/lower limits of the charging capacity.

An estimated life span according to the invention is a designed life span of the secondary battery at the time of designing a system. A battery having the same performance as that of the secondary battery to be mounted in the system before a device is manufactured is generally used to define the estimated life span using a transition of degradation when the battery is repeatedly charging/discharging in a predetermined pattern.

A power storage system includes terminals and wirings (power reception units) to receive supplied power, terminals and wirings (power supply unit) to supply the power to a load, the secondary battery, and a control system of the secondary battery.

The basic concepts of the invention will now be described below.

Figure 1:
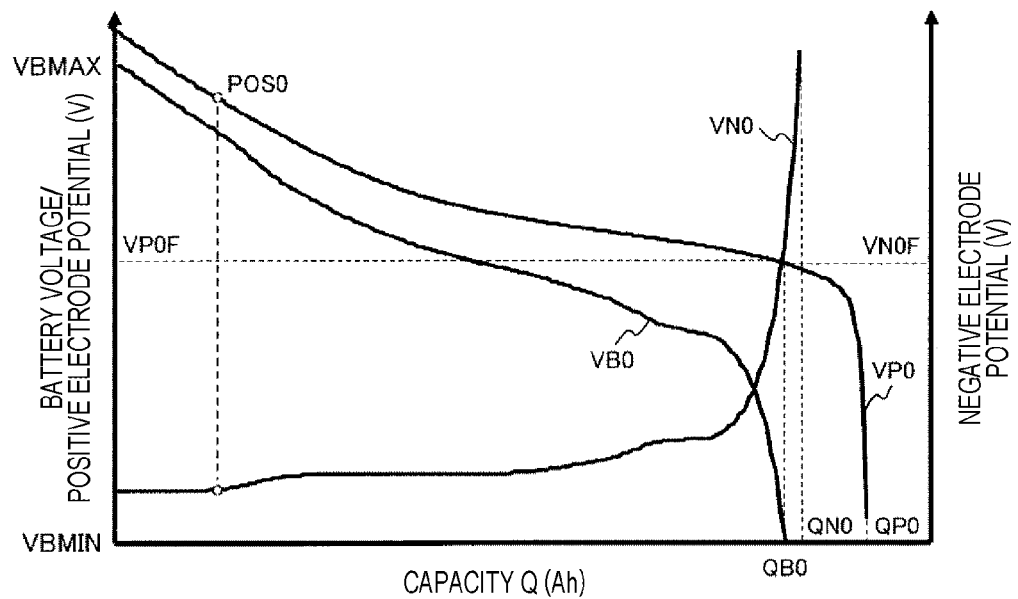
FIG. 1 is a diagram illustrating discharging curves for describing an initial battery capacity of a secondary battery used in the invention.

FIG. 1 is a diagram illustrating discharging curves for describing an initial battery capacity of the secondary battery used in the invention.

The operations of the secondary battery are defined by a battery voltage, and charging/discharging occurs between an upper battery voltage VBMAX and a lower battery voltage VBMIN. In the drawing, the horizontal axis (hereinafter, referred to as "x axis") represents capacities Q, and the vertical axis represents voltages.

In this drawing, the battery voltage is gradually decreased from the upper battery voltage VBMAX as the discharging proceeds from after the discharging starts at the x axis is "0" (capacity Q=0), and the discharging ends when the battery voltage reaches the lower battery voltage VBMIN. The value at an x intercept at that time is defined as a battery capacity QB0. An initial battery voltage curve VB0 is defined by a potential difference between an initial positive electrode potential curve VP0 and an initial negative electrode potential curve VN0. The initial positive electrode potential curve VP0 and the initial negative electrode potential curve VN0 is determined by the amount of active materials attached to the respective electrodes and a state of a conductive network. In addition, the positions of the initial positive electrode potential curve VP0 and the initial negative electrode potential curve VN0 are determined by initial positions POS0 of these two curves. The initial positions POS0 are determined by a ratio of the amount of the active materials attached to the positive and negative electrodes and an irreversible capacity generated when the secondary battery is initialized.

As can be seen from this drawing, an initial positive electrode capacity QP0 and an initial negative electrode capacity Qn0, and an initial positive electrode discharging terminal potential VP0F and an initial negative electrode discharging terminal potential VN0F when the initial battery voltage curve VB0 reaches the lower battery voltage VBMIN can be defined from these discharging curves.

On the contrary, a battery voltage curve VB varies as a use period (an operating time, the number of charging/discharging, and a lifetime charging/discharging accumulation amount) increases.

Figure 2:
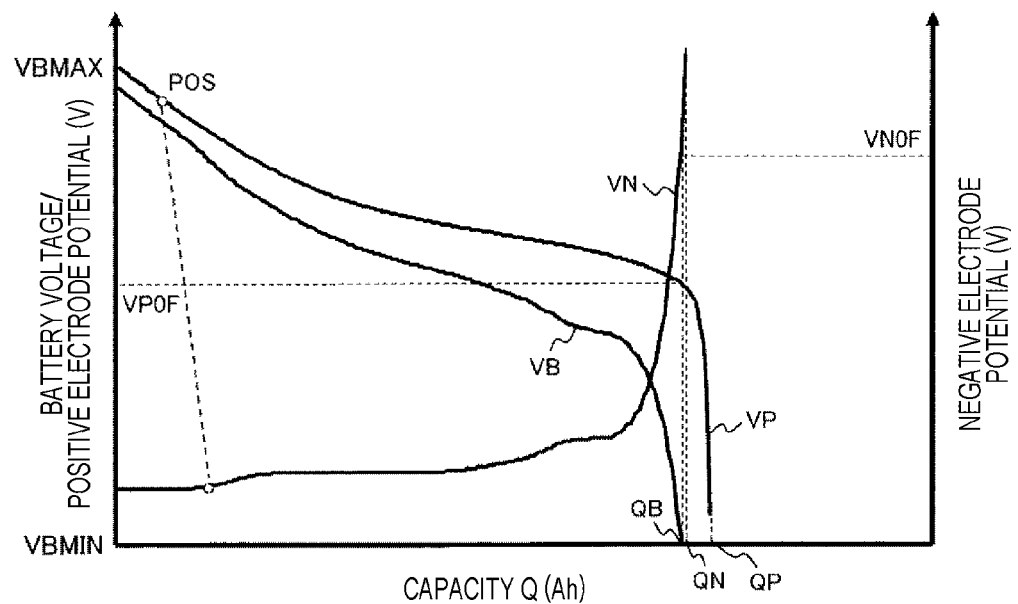
FIG. 2 is a diagram illustrating discharging curves for describing a capacity after the secondary battery used in the invention is degraded.

FIG. 2 is a diagram illustrating discharging curves for describing the capacity after the secondary battery used in the invention is degraded.

A positive electrode potential curve VP after degradation and a positive electrode potential curve VP after degradation are reduced in the x-axis direction by the degradation of the battery. The value of the x intercept is decreased from the battery capacity QB0 at the initial time illustrated in FIG. 1 to a battery capacity QB. A main cause is that the active material contributing to the charging/discharging is reduced because the active material enters an electrically insulated state during a period when the charging/discharging is repeated, and that Li ions inserted into the active material are not detached and thus the charging/discharging is disabled.

Due to the reduction, the positive electrode capacity QP after degradation, a negative electrode capacity QN after degradation, a positive electrode discharging terminal potential VPF after degradation, and a negative electrode discharging terminal potential VNF after degradation also vary. In addition, besides the above reduction, the positions POS of the positive electrode and the negative electrode after the degradation also vary. A main cause is that Li ions inserted into the active material are not detached and thus the charging/discharging is disabled, and that the Li ions are consumed for forming a film generated on the positive and negative electrodes.

As a result, the battery voltage curve VB after degradation defined by the positive electrode potential curve VP after degradation and the negative electrode potential curve VN after degradation also vary in shape. Then, the capacity QB defined by the x intercept is decreased. The above description is a mechanism how the battery capacity is decreased.

The inventor found out that a reverse of the positive electrode capacity QP after degradation and the negative electrode capacity QN after degradation in the mechanism of decreasing the battery capacity causes a steep decrease of battery characteristics, and as a result the battery performance is significantly decreased in a shorter time than the estimated life span.

Therefore, in the invention, the indexes related to these capacities are compared and the control condition of the secondary battery is changed according to the value, so that it is possible to avoid that the life span is shortened by a steep decrease of the battery characteristics. In addition, these indexes are compared using a difference, so that it is also possible to use a processor which has a high-speed processing performance and inexpensive.

Further, in order to monitor these indexes, there is a need to provide a unit to measure or calculate the positive electrode potential curve VP after degradation and the positive electrode potential curve VN after degradation. With his regard, there may be used a technique of inserting a third electrode into the secondary battery other than the positive electrode and the negative electrode to measure the potentials of the positive electrode and the negative electrode, or a technique of calculating a battery voltage after degradation from the battery voltage VB after degradation, the initial positive electrode potential curve VP0, and the initial negative electrode potential curve VN0. Further, the initial positive electrode potential curve VP0 and the initial negative electrode potential curve VN0 are acquired in advance by performing the charging/discharging using the positive electrode, the negative electrode, or a unipolar electrode.

Hereinafter, embodiments of the invention will be described in more detail. However, the invention is not limited to the embodiments, and combinations and improvements can be appropriately made within a scope not departing from a technical idea of the invention.

First Embodiment (Control Method of Secondary Battery)

Figure 3:
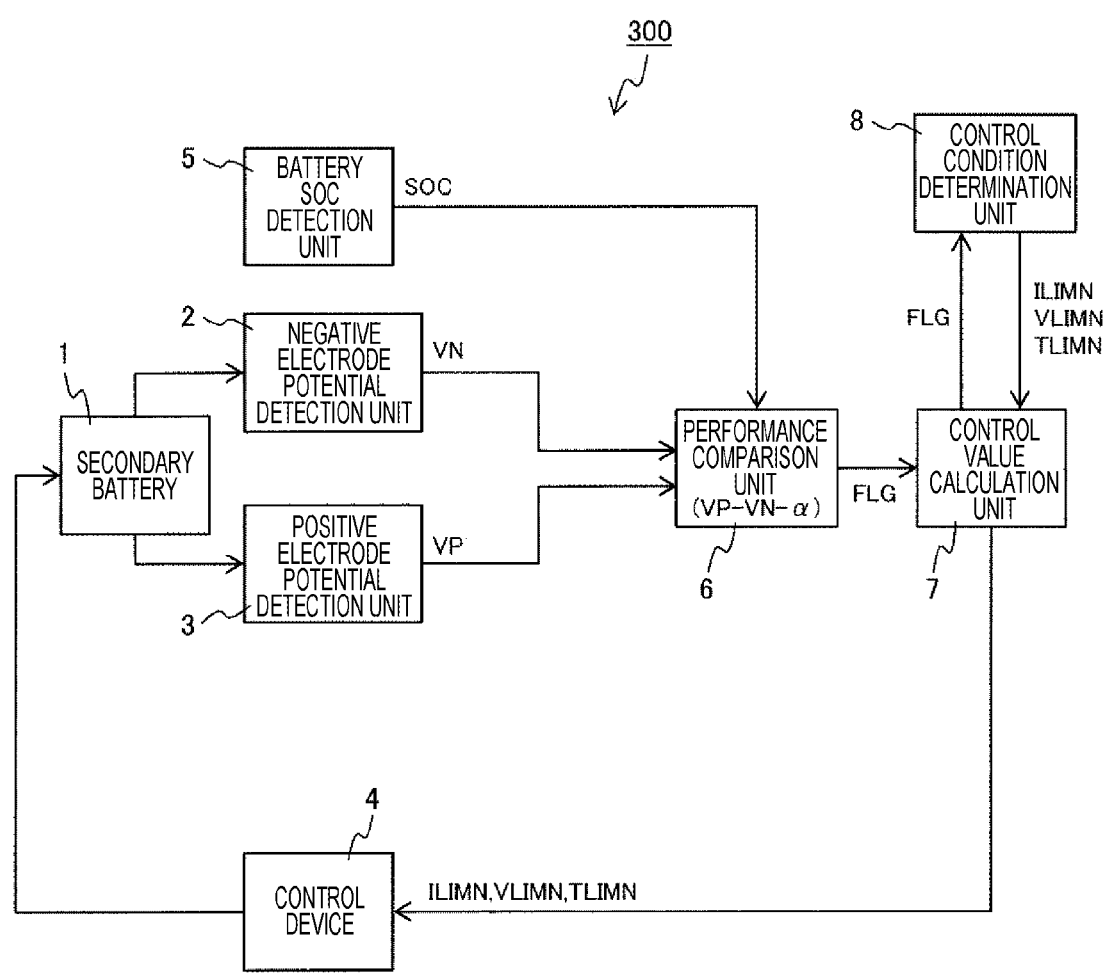
FIG. 3 is a diagram illustrating a control method of a secondary battery in a first embodiment of the invention.

FIG. 3 illustrates a control system of a secondary battery in a first embodiment of the invention. In the drawing, elements surrounded by □ (rectangular) represent components which establish the system. In addition, arrows connecting the components indicate transmission paths of signals. In addition, the signals to be transmitted on the arrows are represented by symbols.

In this embodiment, the potential of the degraded positive electrode VP and the potential of the degraded negative electrode VN are used as the indexes indicating the degradation state of the positive/negative electrodes.

In this drawing, a control system 300 of the secondary battery includes a secondary battery 1, a negative electrode potential detection unit 2, a positive electrode potential detection unit 3, a control device 4, a battery SOC detection unit 5, a performance comparison unit 6, a control value calculation unit 7, and a control condition determination unit 8.

In the control system 300, the potential of the degraded negative electrode VN is measured or calculated using the negative electrode potential detection unit 2. Even in the positive electrode, the potential of the degraded positive electrode VP is measured or calculated in the same procedure. Herein, the positive electrode and the negative electrode are elements of the secondary battery 1.

In the performance comparison unit 6, the potential of the degraded positive electrode VP and the potential of the degraded negative electrode VN are obtained, a different is calculated using these values and a constant term α, and a sign FLG of the calculated result is acquired. Herein, for example, the constant term α is set to about 3.0 V in a case where the lower voltage of the secondary battery 1 is 3.0 V, the initial positive electrode discharging terminal potential is 4.0 V, and the initial negative electrode discharging terminal potential is 1.0 V.

In a case where the sign FLG acquired by the performance comparison unit 6 is negative, a command is transmitted from the control value calculation unit 7 to the control condition determination unit 8, and a new current limit ILIM, a new voltage limit VLIM, and a new temperature limit TELIM of the secondary battery 1 are acquired. The new current limit ILIMN, the new voltage limit VLIMN, and the new temperature limit TELIMN of the secondary battery 1 are transmitted to the control device 4. After this step, the secondary battery 1 is controlled using the new current limit ILIMN, the new voltage limit VLIMN, and the new temperature limit TELIMN.

The control condition determination unit 8 has a map in which reduction speeds of the negative electrode capacity and the positive electrode capacity according to the current limit ILIM, the voltage limit VLIM, and the temperature limit TELIM of the secondary battery 1 are stored. When the sign FLG is input to the control condition determination unit 8, the control condition determination unit 8 sets the new current limit ILIMN, the new voltage limit VLIMN, and the new temperature limit TELIMN such that the reduction speed of the negative electrode capacity QN is decreased, or the reduction speed of the positive electrode capacity QP is increased in order to resolve that the sign FLG becomes negative in the performance comparison unit 6. On the other hand, in a case where the sign FLG obtained in the performance comparison unit 6 is positive, the secondary battery 1 is controlled without rewriting the current limit ILIM, the voltage limit VLIM, and the temperature limit TELIM.

In the control system 300, the potential of the degraded negative electrode VN is measured or calculated using the negative electrode potential detection unit 2. Even in the positive electrode, the potential of the degraded positive electrode VP is measured or calculated in the same procedure. Herein, the positive electrode and the negative electrode are elements of the secondary battery 1.

Hereinafter, the description will be given about a calculation method of estimating accuracy for comparing effects obtained in the first embodiment and the first comparative example.

In a case where the sign FLG acquired by the performance comparison unit 6 is negative, a command is transmitted from the control value calculation unit 7 to the control condition determination unit 8, and a new current limit ILIMN, a new voltage limit VLIMN, and a new temperature limit TELIMN of the secondary battery 1 are acquired. The new current limit ILIMN, the new voltage limit VLIMN, and the new temperature limit TELIMN of the secondary battery 1 are transmitted to the control device 4. After this step, the secondary battery 1 is controlled using the new current limit ILIMN, the new voltage limit VLIMN, and the new temperature limit TELIMN.

The accuracy of the capacity estimation is calculated using the capacity measurement result of the fourteenth cycle and a value estimated using the root rule. In a case where the measured capacity and the estimated capacity are completely matched, the estimation accuracy is defined as 0%. With this regard, in a case where the estimated capacity is two or ½ times the measured capacity, the estimation accuracy is defined as 100%.

The results of the first embodiment and the first comparative example are listed in Table 1.

From this table, it can be seen that a life estimation accuracy exceeds 20% in the first comparative example, and the estimation accuracy is insufficient. On the other hand, in the first embodiment, the performances of the positive electrode and the negative electrode are compared to change the control condition, and it becomes clear that the estimation accuracy can be improved up to 2.0%.

Therefore, according to the first embodiment, it is possible to obtain a life characteristic close to the estimated life span of the secondary battery which is estimated at the time of designing the system by preventing the battery performance from being steeply decreased. In addition, these indexes are compared using a difference, so that it is also possible to use a processor which has a high-speed processing performance and is inexpensive.

In this embodiment, the root rule is used for the capacity estimation as a system to verify the effect. However, the invention is not limited to the root rule, but any system which is able to estimate a transition of the capacity of the secondary battery may be used as long as the same effect is obtained.

TABLE 1

| Monitor item: Active material utilization | Life estimation accuracy |
|---|---|
| First embodiment | 2.0% |
| First comparative example | 20.8% |

In this embodiment, the battery SOC detection unit 5 is provided as illustrated in FIG. 3. Since the performance at the discharging terminal of the battery can be compared with high accuracy, the calculation in the performance comparison unit 6 is logically configured by performing calculation if the SOC of the battery is equal to or less than a certain constant (for example, 10% or less), so that the control can be performed with high accuracy while achieving a high speed by reducing the calculation frequency.

Second Embodiment

Figure 4:
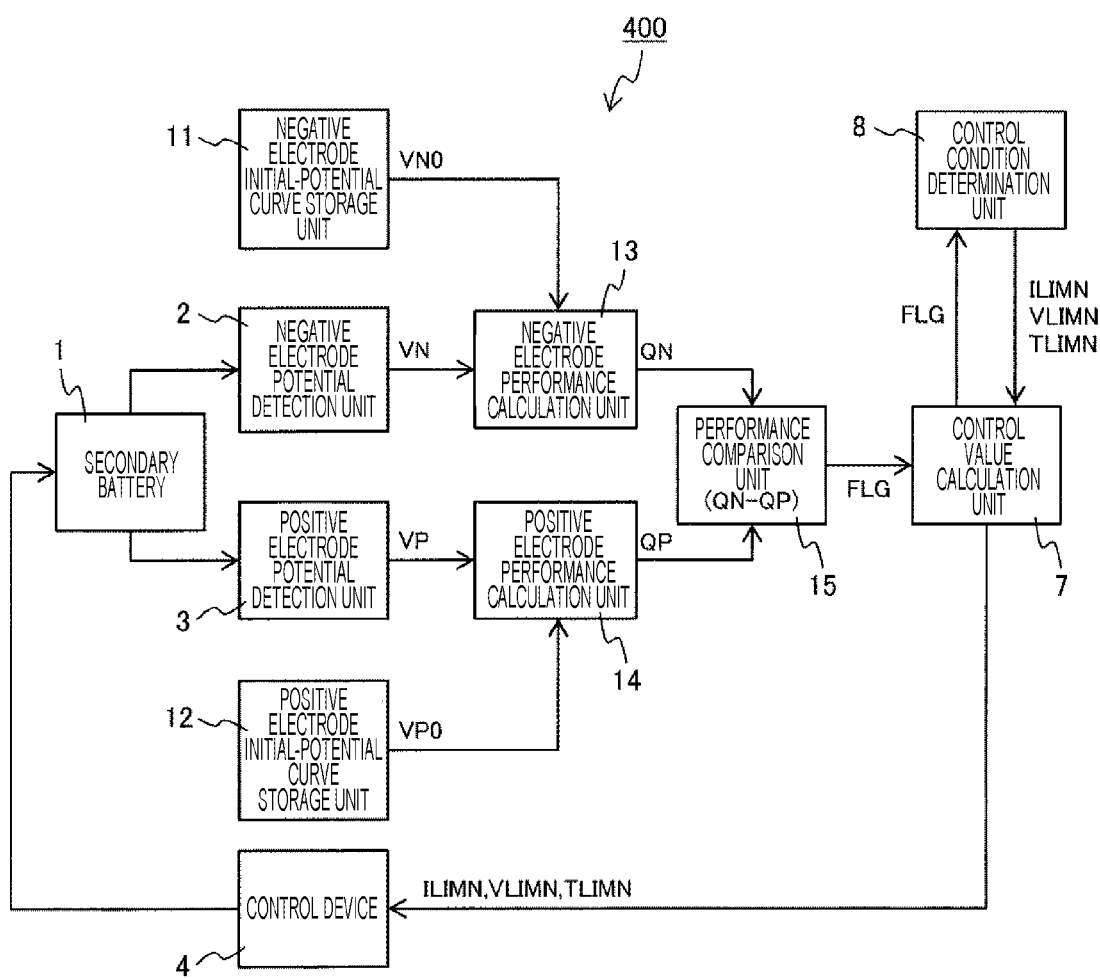
FIG. 4 is a diagram illustrating a control method of a secondary battery in a second embodiment of the invention.

FIG. 4 illustrates a control system of the secondary battery in a second embodiment of the invention.

In this drawing, a control system 400 of the secondary battery includes the secondary battery 1, the negative electrode potential detection unit 2, the positive electrode potential detection unit 3, the control device 4, a performance comparison unit 15, the control value calculation unit 7, and the control condition determination unit 8. Further, the control system 400 includes a negative electrode initial-potential curve storage unit 11, a positive electrode initial-potential curve storage unit 12, a negative electrode performance calculation unit 13, and a positive electrode performance calculation unit 14.

The battery SOC detection unit 5 illustrated in FIG. 3 (the first embodiment) is not included.

In this embodiment, the explanation of the same elements as those of the first embodiment will be omitted. In this embodiment, the positive electrode capacity QP after degradation and the negative electrode capacity QN after degradation are used as indexes indicating the degradation states of the positive/negative electrodes.

In this embodiment, the measurement or the calculation of the negative electrode potential curve VN after degradation is performed using a negative electrode potential curve detection unit 2. Thereafter, the negative electrode performance calculation unit 13 compares the initial negative electrode potential curve VN0 and the negative electrode potential curve VN stored in the negative electrode initial-potential curve storage unit 11 to calculate the negative electrode capacity QN after degradation. Even in the positive electrode, the positive electrode capacity QP after degradation is measured or calculated in the same procedure.

The performance comparison unit 15 compares a difference between the negative electrode capacity QN after degradation and the positive electrode capacity QP after degradation to determine the sign FLG.

In this embodiment, the positive electrode capacity QP after degradation and the negative electrode capacity QN after degradation have been used as indexes used in the control. However, even when the discharging terminal potential VNF of the negative electrode after degradation is calculated by the negative electrode performance calculation unit 13, the positive electrode discharging terminal potential VPF after degradation is calculated by the positive electrode performance calculation unit 14, and the performances are compared from these values by the same procedure, the same effect can be achieved.

In this embodiment, since the initial negative electrode capacity Qn0 and the initial positive electrode capacity QP0 are in relationship of Qn0>QP0, the control condition when the sign FLG is negative is rewritten. However, the control condition may be rewritten when the sign FLG is positive in a case where the relationship is reversed. Alternatively, QP−QN may be calculated in the performance comparison unit 15, and the control condition may be rewritten when the sign FLG is negative may be rewritten.

In this embodiment, a difference between the positive electrode capacity QP after degradation and the negative electrode capacity QN after degradation is obtained by the performance comparison unit 15, and the rewriting is determined by the sign FLG. However, the coefficient α may be added when the difference is calculated. In this case, the control containing likelihood can be performed, and the life characteristic close to the estimated life span of the secondary battery assumed at the time of designing the system comes to be easily obtained.

In all the embodiments, the root rule has been used as a capacity estimation, but the invention is not limited thereto. The same effect is achieved when a system which can estimate the transition of the capacity of the secondary battery 1 is used.

In all the embodiments, the current value, the voltage value, and the temperature have been used in the control device 4 as the control factors of the secondary battery 1. However, even when a range of the SOC and a value of the center SOC are used in the control, the effect of the invention is not changed.

Finally, an example of a control method of the secondary battery of the invention will be described.

Figure 5:
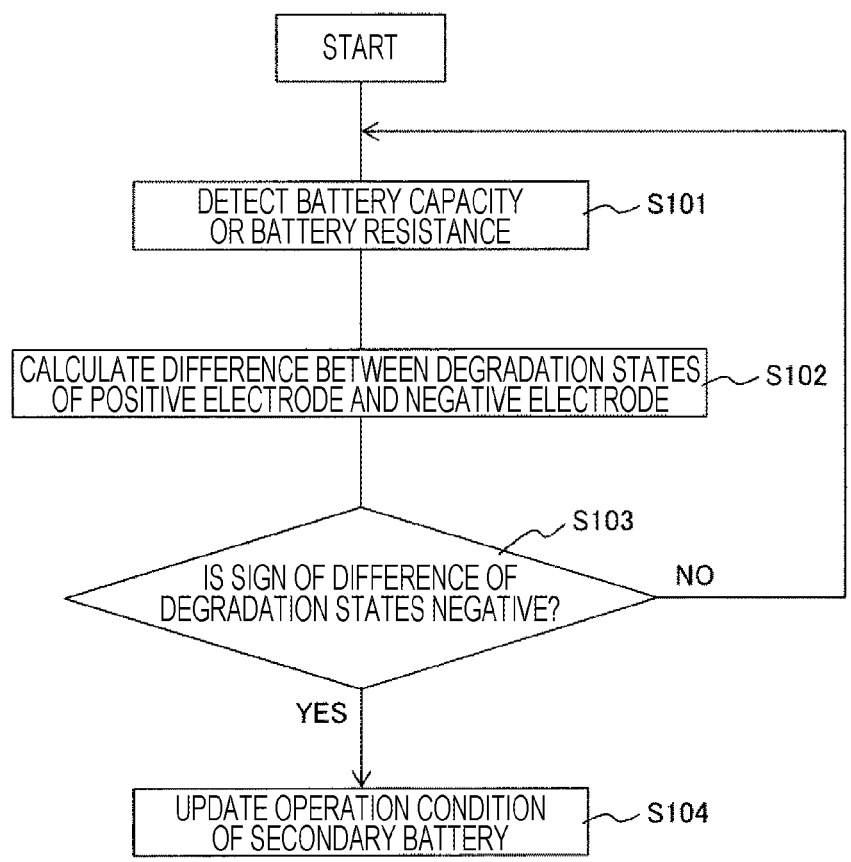
FIG. 5 is a flowchart illustrating a control method of the secondary battery of the invention.

FIG. 5 is a flowchart illustrating a control method of the secondary battery of the invention.

As illustrated in this drawing, when the control starts, the battery capacity or the battery resistance is detected (S101), and a difference between the degradation states of the positive electrode and the negative electrode is calculated (S102). Then, the sign of the difference between the degradation states is determined whether it is positive or negative (S103). In a case where the sign is negative, the operation condition of the secondary battery is changed (S104). On the other hand, in a case where the sign is positive, the procedure returns to the process of S101 to detect the battery capacity or the battery resistance.

REFERENCE SIGNS LIST 1 secondary battery
2 negative electrode potential detection unit
3 positive electrode potential detection unit
4 control device 5 battery SOC detection unit
6, 15 performance comparison unit
7 control value calculation unit
8 control condition determination unit
11 negative electrode initial-potential curve storage unit
12 positive electrode initial-potential curve storage unit
13 negative electrode performance calculation unit
14 positive electrode performance calculation unit
300, 400 control system
VBMAX upper battery voltage
VBMIN lower battery voltage
VB0 initial battery voltage curve
VP0 initial positive electrode potential curve
VN0 initial negative electrode potential curve
POS0 positions of initial positive electrode potential curve and initial negative electrode potential curve
QP0 initial positive electrode capacity
Qn0 initial negative electrode capacity
VP0F initial positive electrode discharging terminal potential
VN0F initial negative electrode discharging terminal potential
VP positive electrode potential curve after degradation
VN negative electrode potential curve after degradation
VB battery voltage curve after degradation
POS positions after positive electrode and negative electrode are degraded
QP positive electrode capacity after degradation
QN negative electrode capacity after degradation
VPF positive electrode discharging terminal potential after degradation
VNF negative electrode discharging terminal potential after degradation
FLG sign

The invention claimed is:

1. A power storage system, comprising:
   a power reception unit which is used to receive supplied power;
   a power supply unit which is used to supply power to a load;
   a secondary battery; and
   a control processor of the secondary battery is configured to,
   detect a positive electrode index indicating a degradation state of a positive electrode,
   detect a negative electrode index indicating a degradation state of a negative electrode,
   calculate a difference between the positive electrode index, the negative electrode index and a constant, and determine a sign of the difference,
   wherein when the sign of the difference is negative, a new set of operation conditions are acquired producing at least one of a decrease in reduction speed of a negative electrode capacity and an increase in a reduction speed of a positive electrode capacity, and
   wherein when the sign of the difference is positive the secondary battery remains controlled by a current set of operating conditions.

2. The power storage system according to claim 1, wherein the secondary battery is a lithium-ion secondary battery.

3. The power storage system according to claim 1, wherein the positive electrode index and the negative electrode index each includes a capacity of the secondary battery.

4. The power storage system according to claim 1,
   wherein the positive electrode index includes at least one of an electrode potential with respect to an end stage of discharging of the secondary battery and capacities of the positive electrode, and
   wherein the negative electrode index includes at least one of an electrode potential with respect to an end stage of discharging of the secondary battery and capacities of the negative electrode.

5. The power storage system according to claim 1,
   wherein the operation conditions are at least one of an upper limit value of a current, upper/lower limit values of a temperature, and upper/lower voltages of the secondary battery.

6. A control system of a secondary battery, comprising:
   a secondary battery; and
   a processor of the secondary batter configured to
   detect a negative electrode index indicating a degradation state of a positive electrode of the secondary battery,
   detect a negative electrode index of a degradation state of a negative electrode of the secondary battery,
   calculate a difference between the positive electrode index, the negative electrode index and a constant, and determine a sign of the difference,
   wherein when the sign of the difference is negative, a new set of operation conditions are acquired producing at least one of a decrease in a reduction speed of a negative electrode capacity and an increase in a reduction speed of a positive electrode capacity, and
   wherein when the sign of the difference is positive the secondary battery remains controlled by a current set of operating conditions.

7. The control system of the secondary battery according to claim 6, wherein the secondary battery is a lithium-ion secondary battery.

8. The control system of the secondary battery according to claim 6, wherein the positive electrode index and the negative electrode index each includes a capacity of the secondary battery.

9. The control system of the secondary battery according to claim 6,
   wherein the positive electrode index includes at least one of an electrode potential with respect to an end stage of discharging of the secondary battery and capacities of the positive electrode, and
   wherein the negative electrode index includes at least one of an electrode potential with respect to an end stage of discharging of the secondary battery and capacities of the negative electrode.

10. The control system of the secondary battery according to claim 6,
    wherein the operation conditions are at least one of an upper limit value of a current, upper/lower limit values of a temperature, and upper/lower voltages of the secondary battery.

11. A control method of a secondary battery, comprising:
    detecting, via a processor of the secondary battery, a positive electrode index indicating a degradation state of a positive electrode of the secondary battery;
    detecting, via the processor, a negative electrode index indicating a degradation state of a negative electrode of the secondary battery;
    calculating, via the processor, a difference between the positive electrode index, the negative electrode index and a constant; and
    determining a sign of the difference;
    wherein when the sign of the difference is negative, a new set of operation conditions are acquired producing at least one of a decrease in a reduction speed of a negative electrode capacity and an increase in a reduction speed of a positive electrode capacity, and wherein when the sign of the difference is positive the secondary battery remains controlled by a current set of operating conditions.

12. The control method of the secondary battery according to claim 11, wherein the secondary battery is a lithium-ion secondary battery.

13. The control method of the secondary battery according to claim 11, wherein the positive electrode index and the negative electrode index each includes a capacity of the secondary battery.

14. The control method of the secondary battery according to claim 11, wherein the positive electrode index includes at least one of an electrode potential with respect to an end stage of discharging of the secondary battery and capacities of the positive electrode, and wherein the negative electrode index includes at least one of an electrode potential with respect to an end stage of discharging of the secondary battery and capacities of the negative electrode.

15. The power storage system according to claim 11, wherein the operation conditions are at least one of an upper limit value of a current, upper/lower limit values of a temperature, and upper/lower voltages of the secondary battery.

* * * * *